(12) United States Patent
Mozetic et al.

(10) Patent No.: US 12,312,679 B2
(45) Date of Patent: May 27, 2025

(54) METHOD FOR PRODUCING N-DOPED CARBON NANOMESH

(71) Applicant: Jožef Stefan Institute, Ljubljana (SI)

(72) Inventors: Miran Mozetic, Ljubljana (SI); Alenka Vesel, Ljubljana (SI); Gregor Primc, Ljubljana (SI); Rok Zaplotnik, Ljubljana (SI)

(73) Assignee: JožStefan Institute, Ljubljana (SI)

( * ) Notice: Subject to any disclaimer, the term of this patent is extended or adjusted under 35 U.S.C. 154(b) by 0 days.

(21) Appl. No.: 17/130,417

(22) Filed: Dec. 22, 2020

(65) Prior Publication Data

US 2022/0195593 A1    Jun. 23, 2022

(51) Int. Cl.
| | |
|---|---|
| *C23C 16/50* | (2006.01) |
| *C23C 16/26* | (2006.01) |
| *C23C 16/448* | (2006.01) |
| *C23C 16/46* | (2006.01) |
| *C23C 16/505* | (2006.01) |
| *C23C 16/511* | (2006.01) |
| *C23C 16/54* | (2006.01) |
| *H01G 11/84* | (2013.01) |

(52) U.S. Cl.
CPC .......... *C23C 16/26* (2013.01); *C23C 16/4488* (2013.01); *C23C 16/46* (2013.01); *C23C 16/505* (2013.01); *C23C 16/511* (2013.01); *C23C 16/545* (2013.01); *H01G 11/84* (2013.01)

(58) Field of Classification Search
CPC .................................................... C23C 16/26
See application file for complete search history.

(56) References Cited

U.S. PATENT DOCUMENTS

| | | | |
|---|---|---|---|
| 9,150,418 B2 | 10/2015 | Boyd | |
| 10,041,168 B2 | 8/2018 | Boyd et al. | |
| 2021/0234167 A1* | 7/2021 | Zhamu | H01M 10/0565 |

FOREIGN PATENT DOCUMENTS

| | | |
|---|---|---|
| CN | 102745678 | 10/2012 |
| CN | 103910349 | 7/2014 |
| CN | 105336505 | 2/2016 |
| CN | 106744898 | 5/2017 |
| CN | 107863394 | 3/2018 |
| CN | 108203813 | 6/2018 |
| CN | 108525693 | 9/2018 |
| CN | 110350206 | 10/2019 |

(Continued)

OTHER PUBLICATIONS

Boas et al., "Characterization of nitrogen doped graphene bilayers synthesized by fast, low temperature microwave plasma-enhanced chemical vapour deposition," Scientific Reports, Sep. 2019, 9:13715, 1-12.

(Continued)

*Primary Examiner* — David P Turocy
(74) *Attorney, Agent, or Firm* — Fish & Richardson P.C.

(57) ABSTRACT

A method for deposition of nitrogen-doped nanocarbon comprises disposing molten polymer and a heated substrate in a plasma reactor; providing dense nitrogen-containing plasma in the plasma reactor in a space between the molten polymer and the heated substrate; and allowing the dense nitrogen-containing plasma to interact with both the molten polymer and the heated substrate to form a film of nitrogen-containing nanocarbon on the heated substrate.

15 Claims, 3 Drawing Sheets

(56) References Cited

FOREIGN PATENT DOCUMENTS

| | | | |
|---|---|---|---|
| EP | 2682367 A2 * | 1/2014 | ............. B82Y 30/00 |
| JP | 2017-188241 | 10/2017 | |
| JP | 2018-070977 | 5/2018 | |
| JP | 6562331 | 8/2019 | |
| KR | 2013-0034182 | 4/2013 | |
| KR | 2015-0017795 | 2/2015 | |
| KR | 2017-0056390 | 5/2017 | |
| KR | 2019-0083506 | 7/2019 | |
| RU | 2717069 | 3/2020 | |
| WO | WO-2016167583 A1 * | 10/2016 | ......... C01B 31/0453 |
| WO | WO 2017/012281 | 1/2017 | |
| WO | WO-2019238206 A1 * | 12/2019 | ............. C01B 32/18 |

OTHER PUBLICATIONS

Bundaleska et al., "Large-scale synthesis of free-standing N-doped graphene using microwave plasma," Scientific Reports, Aug. 2018, 8:12595, 1-11.

Dias et al., "Production of N-graphene by microwave N2-Ar plasma," J. Phys. D: Appl. Phys., Jan. 2016, 49(5):055307, 1-9, 10 pages.

Evlashin et al., "N-Doped Carbon Nano Walls for Power Sources," Scientific Reports, Apr. 2019, 9:6716, 1-7.

Jeong et al., "Nitrogen-Doped Graphene for High-Performance Ultracapacitors and the Importance of Nitrogen-Doped Sites at Basal Planes," Nano Letters, May 2011, 11(6):2472-2477.

Lin et al., "3D Nitrogen-doped graphene prepared by pyrolysis of graphene oxide with polypyrrole for electrocatalysis of oxygen reduction reaction," Nano Energy, Mar. 2013, 2(2):241-248.

Vesel et al., "A Review of Strategies for the Synthesis of N-Doped Graphene-Like Materials," Nanomaterials, Nov. 2020, 10(11):2286, 36 pages.

Vesel et al., "One-Step Plasma Synthesis of Nitrogen-Doped Carbon Nanomesh," Nanomaterials, Mar. 2021, 11(4):837, 16 pages.

Zhang et al., "Tunable electronic properties of graphene through controlling bonding configurations of doped nitrogen atoms," Scientific Reports, Jun. 2016, 6:28330, 1-10.

* cited by examiner

METHOD FOR PRODUCING N-DOPED CARBON NANOMESH

BACKGROUND

The efficiency of electrochemical devices increases with increasing surface-to-mass ratio. Carbon is among the lightest and most widely available electrically conductive materials and can be deposited on a substrate in various forms including soot, hydrogenated-carbon, fullerenes, nanotubes, nanowalls, nanosheets, vertical graphene, etc. Nanocarbon structures are generally several nanometers in thickness. An example of a nanocarbon structure is vertically oriented multilayer graphene, followed by nanomesh including stochastically oriented single- or multi-layer graphene sheets. The nanocarbon materials are decorated with different elements in the form of single-atom defects, nanoclusters, or nanoparticles. High activity is observed for nanocarbon materials decorated with clusters of noble metals like platinum. Noble metals are expensive so there is a trend of replacing them with cheaper materials. One possible solution is doping nanocarbon with nitrogen. Nitrogen can be chemically bonded to graphene structure in pyridine, pyridine, pyrole or graphitic nitrogen, depending on the binding site. The graphite bonding is often preferred.

A trivial solution to decoration of nanocarbon is treatment of as-deposited materials with nitrogen. Nanocarbon of desired properties is first deposited onto a substrate using any suitable method, and then treated by chemically active nitrogen, often nitrogen plasma. The nitrogen ions and/or atoms interact chemically with the surface film of nanocarbon. The technique is used for modification of nanocarbon that can be reached by nitrogen atoms or ions. The nanocarbon deep inside a carbon nanomesh, for example, will not be affected much upon the treatment with nitrogen plasma.

An alternative to treatment of as-deposited nanocarbon with nitrogen plasma is the deposition of nitrogen-containing nanocarbon using plasma sustained in a mixture of a carbon-containing gas (often methane or acetylene) and nitrogen. Other gases may be leaked into the plasma reactor. The plasma technique may be combined with a wet chemical method. Nanocarbon may be synthesized without using substrates, e.g., using a fluidized bed reactor with plasma sustained by inductively coupled RF discharge in a mixture of nitrogen and gaseous hydrocarbons. Carbon nitride films also can be prepared by sputtering carbon targets in nitrogen atmosphere.

Deposition of nitrogen-containing carbon nanomaterials from gaseous precursors via a plasma technique can have low deposition rates or can result in poor quality of the deposited films. For instance, the deposition rate can be low when a low density of hydrocarbon gases is present in the plasma reactor. When the density is increased, carbon is not deposited as high-quality nanocarbon but rather as a film of hydrogenated carbon of low surface-to-mass ratio.

SUMMARY

This description relates to approaches for deposition of nitrogen-doped carbon nanomaterials, such as nitrogen-doped graphene nanomesh of high surface-to-mass ratio. These materials are useful for application in electrochemical devices such as super-batteries, super-capacitors and fuel cells. The approaches described here provide rapid deposition of nitrogen-doped carbon nanomaterials using a low-pressure reactor where nitrogen plasma is contacted with molten polymer and a heated substrate.

For instance, the approaches described here relate to the deposition of nanocarbon with a concentration of chemically bonded nitrogen in the range between about 2 and 20 atomic percent. The nanocarbon is in the form of randomly oriented graphene nanosheets or nanoflakes of individual dimension of 100 nm or less. Nitrogen atoms are chemically bonded to the graphene structure in various configurations such as graphitic, pyridine, and pyrrolic nitrogen. These structures are deposited in the form of thin films of few micrometers thickness.

In an aspect, a method for deposition of nitrogen-doped nanocarbon comprises disposing molten polymer and a heated substrate in a plasma reactor; providing dense nitrogen-containing plasma in the plasma reactor in a space between the molten polymer and the heated substrate; and allowing the dense nitrogen-containing plasma to interact with both the molten polymer and the heated substrate to form a film of nitrogen-containing nanocarbon on the heated substrate.

Embodiments can include one or any combination of two or more of the following features.

The molten polymer can be at a temperature of between 200 and 600° C., e.g., at a temperature of between 300 and 400° C.

The heated substrate can be at a temperature of between 300 and 1200° C., e.g., at a temperature of between 600 and 900° C.

Providing the dense nitrogen plasma can include applying a power used of between 0.1 and 100 MW/m3, e.g., applying a power of between 1 and 30 MW/m3.

The nitrogen pressure in the plasma reactor can be between 0.1 and 1000 Pa, e.g., between 1 and 50 Pa.

The method can include sustaining the nitrogen plasma by a low-pressure gaseous discharge. The method includes sustaining the nitrogen plasma by inductively coupled radiofrequency discharge or by microwave discharge.

The method can include depositing the nitrogen-containing nanocarbon film on the heated substrate.

Disposing the heated substrate in the plasma reactor can include moving an elongated substrate through the reactor. The method can include cutting the elongated substrate following formation of the film of nitrogen-containing nanocarbon on the substrate.

In an aspect, a method of making an electrochemical device includes depositing a film of nitrogen-doped nanocarbon, comprising: disposing molten polymer and a heated substrate in a plasma reactor; providing nitrogen-containing plasma in the plasma reactor in a space between the molten polymer and the heated substrate; and allowing the nitrogen-containing plasma to interact with both the molten polymer and the heated substrate to form the film of nitrogen-containing nanocarbon on the heated substrate. The method includes forming an electrochemical device containing the film of nitrogen-containing nanocarbon.

Embodiments can include one or any combination of two or more of the following features.

The electrochemical device can include a super-battery, a super-capacitor, or a fuel cell.

In an aspect, a method includes disposing a molten polymer and a substrate in a plasma reactor, wherein the molten polymer is at a temperature of between 200° C. and 500° C.; heating the substrate to a temperature of between 300° C. and 1200° C.; maintaining a pressure in the plasma reactor of between 1 and 1000 Pa; providing a gaseous, nitrogen-containing plasma in the plasma reactor by application of a power density of between 0.1 and 100 MW/m³; allowing the gaseous, nitrogen-containing plasma to interact with the molten polymer and the heated substrate to deposit a film of nitrogen-containing nanocarbon on the heated substrate.

The details of one or more implementations are set forth in the accompanying drawings and the description below. Other features and advantages will be apparent from the description and drawings, and from the claims.

DETAILED DESCRIPTION

Figure 1:
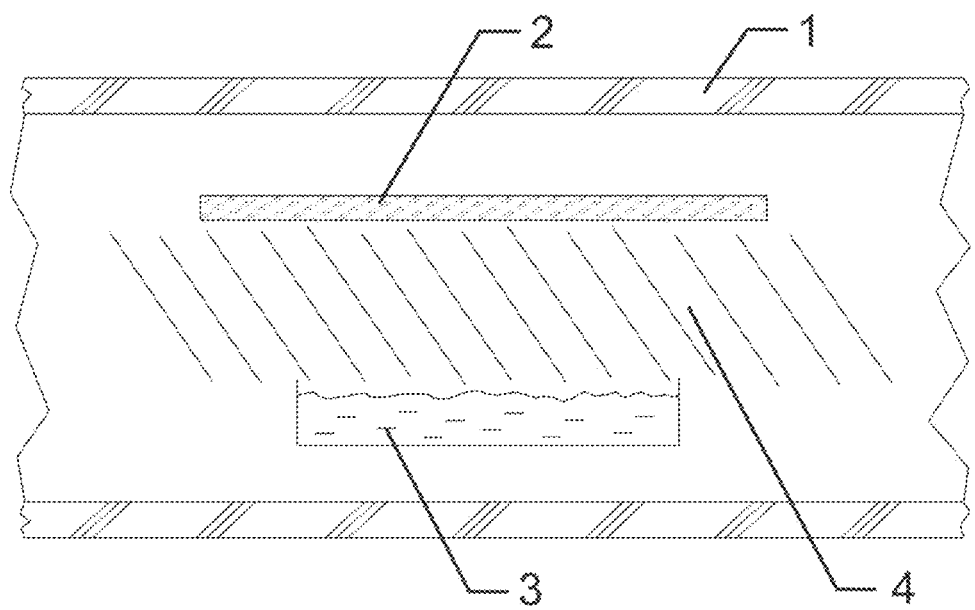
FIG. 1 is a diagram of a system for deposition of nitrogen-containing nanocarbon.

This description relates to the deposition of nitrogen-containing nanocarbon, such as thin films of nanocarbon, e.g., carbon nanomesh, with a nitrogen concentration between about 2 and 20 atomic %. The nitrogen-containing nanocarbon is fabricated by disposing melted polymer and a heated substrate in a hermetically tight low-pressure plasma reactor, filling the plasma reactor with nitrogen, and generating a gaseous discharge in the plasma reactor, in particularly within the space between the molten polymer and the substrate. Molten polymer at elevated temperature is employed as a source of carbon. Nitrogen plasma in the reactor serves as a carrier of nitrogen-containing hydrogen-depleted polymer molecular fragments from the surface of the molten polymer to the surface of the heated substrate. These methods enable the deposition of nanocarbon with about 10 atomic % nitrogen chemically bonded to a multilayer graphene structure at the rate of about 50 nm/s, which is useful for rapid synthesis of nitrogen-containing structures of high surface-to-mass ratio. These methods enable deposition of nitrogen-containing nanocarbon in both batch and continuous modes.

Plasma-enhanced chemical vapor deposition (PECVD) is a widely used technique for the deposition of various coatings, e.g., from thin films of compact polymer-like material to hydrogenated carbon and diamond. PECVD can be used to deposit nanocarbon. For instance, in PECVD nanocarbon deposition, a carbon precursor (usually methane, acetylene or any other suitable monomer) is leaked into a plasma reactor. A noble gas is often added to facilitate higher ionization and/or dissociation fraction of precursor upon plasma conditions and to assure for better plasma uniformity. Another gas is sometimes added intentionally. In many cases, there is a residual atmosphere in a low-pressure plasma reactor. The residual atmosphere is often water vapor. The small quantities of reactive gases like oxygen or hydrogen is often beneficial for the PECVD process because the reactive gases (usually highly dissociated) interact with improperly deposited material and thus help ensure appropriate crystallinity and other properties of the deposited films.

PECVD generally operates at precursor partial pressure below 100 Pa, or even a few Pa. Such conditions prevent agglomeration of precursor radicals in the gas phase. Agglomerates not only cause drifting of plasma parameters but are likely to deposit on the substrates in the form of nanospheres what is usually detrimental for the quality of nanocarbon films. Nanocarbon can be deposited by PECVD at elevated pressure or even atmospheric pressure, but the deposit often contains soot or hydrogenated carbon film of poor surface-to-mass ratio.

Nitrogen may be leaked into the plasma reactor upon PECVD of nanocarbon. Nitrogen plasma species interact chemically with the precursors. A typical interaction product is hydrogen cyanide which is very poisonous. An addition of nitrogen into the PECVD reactor with the precursors suppresses the deposition rate because a significant fraction of nitrogen species is spent in etching of the depositing film. Nitrogen is incorporated well in the carbon structure provided the carbon source is almost free from hydrogen. For example, thin films of carbon nitride are deposited using magnetron sputtering of a graphite target upon controlled dosage of nitrogen. In the cases where both gaseous hydrocarbons and nitrogen is leaked into the plasma reactor, the quality of the deposited films vary due to competition between deposition and etching. The quality may be time-dependent because the precursor and nitrogen are utilized at different rates, depending on the evolution of the deposited film.

In the approaches described here for deposition of nitrogen-containing nanocarbon, instead of using light gaseous hydrocarbons as precursors, the molten polymer serves as a stock of carbon in the plasma reactor. The interaction of nitrogen plasma species with molten polymer is extensive but controllable by adjustment of plasma parameters and the temperature of the molten polymer. The interaction leads to functionalization of the liquid polymer with nitrogen groups and formation of polymer molecular fragments with chemically bonded nitrogen. The fragments have a rather high vapor pressure at the selected temperature of molten polymer and will detach from the surface of the molten polymer upon treatment with nitrogen plasma. The fragments may include compounds of carbon, hydrogen and nitrogen. Among known fragments are hydrogenated dicyanopolyynes, which are chains of hydrogen-depleted polymers terminated by nitrogen atoms. These molecules are difficult to synthesize upon thermodynamic equilibrium. The nitrogen-containing hydrogen-depleted fragments of polymers desorb from the surface of molten polymer, enter the gaseous plasma between the molten polymer and the substrate and are partially radicalized upon plasma conditions. They diffuse in plasma and reach the substrate surface. The substrate is heated to elevated temperature so the radicals are further de-hydrogenated and represent building blocks for crystalline nanocarbon.

FIG. 1 shows a diagram of a system for deposition of nitrogen-containing nanocarbon. The interior of a plasma reactor 1 holds a substrate 2 and a molten polymer 3. The interior of the plasma reactor 1 is evacuated to remove air. Then, nitrogen is leaked into the reactor to achieve a target pressure. Gaseous, nitrogen-containing plasma 4 is sustained in the plasma reactor 1, e.g., by a low-pressure gaseous discharge. The gaseous plasma is dense in particular in the volume between the substrate 2 and the molten polymer 3, such that the gaseous plasma 4 is in contact with both the substrate 2 and the molten polymer 3. The gaseous plasma can be pure nitrogen or a nitrogen-containing gas such as ammonia. The configuration in FIG. 1 can be used for deposition of nitrogen-containing nanocarbon in batch mode.

In operation, gaseous plasma is generated in the nitrogen-rich atmosphere in the plasma reactor at low pressure. The molten polymer at elevated temperature serves a as a source of carbon. The nitrogen plasma interacts with the molten polymer, serving as a carrier of nitrogen-containing hydrogen-depleted polymer molecular fragments from the surface of the molten polymer to the surface of the heated substrate. This interaction results in deposition, onto the heated substrate, of gaseous products formed upon interaction of nitrogen plasma with the molten polymer. This approach enables the deposition of nanocarbon with about 10 atomic % nitrogen chemically bonded to a multilayer graphene structure at the rate of about 50 nm/s, which is useful for rapid synthesis of nitrogen-containing structures of high surface-to-mass ratio.

Reactive gaseous particles created in nitrogen at low pressure (positively charged ions, neutral molecules in the metastable excited states, neutral atoms etc.) interact chemically with the molten polymer, forming various hydrogenated carbon nitrides, for example hydrogenated dicyanopolyynes and percyanoalkynes. The hydrogenated carbon nitrides are partially decomposed and ionized upon plasma conditions. The fragments diffuse in plasma between the molten polymer and the substrate and condense on the substrate surface. Depending on plasma parameters and the substrate temperature, carbon containing hydrogen and nitrogen deposits on the substrate surface. Within limited conditions, nanocarbon almost free from hydrogen but rich in nitrogen is deposited on the substrate surface. A moderately high substrate temperature prevents hydrogenation of the deposited film and thus helps ensure desired electrical properties of the deposited nitrogen-containing nanocarbon.

The rate of producing nitrogen-containing hydrogen-depleted fragments of polymers depends on the temperature of the molten polymer and the power density of the electrical discharge used for sustaining nitrogen plasma in the volume between the molten polymer and the substrate. Elevated temperatures of molten polymer facilitate chemical reactions of nitrogen plasma species with the surface of the molten polymer, e.g., by allowing extensive chemical interaction of nitrogen plasma with the molten polymer. On the other hand, overly high temperatures of the molten polymer can cause rapid thermal degradation of the polymer, which in turn can hinder or prevent formation of chains of hydrogen-depleted polymers terminated by nitrogen atoms. In some examples, the deposition process is carried out with the molten polymer 3 at a temperature above 200° C. or above 300° C., e.g., between 200 and 500° C., e.g., between 300 and 400° C.

The rate of producing nitrogen-containing hydrogen-depleted fragments of polymers also depends on the density of nitrogen plasma in the volume between the molten polymer and the substrate. The plasma density depends on the discharge power density. A higher power density, which is high power dissipated in a volume of glowing plasma, causes a higher rate of producing nitrogen-containing hydrogen-depleted fragments of polymers. On the other hand, very high power density can cause atomization of gaseous molecules in plasma and full degradation of gaseous products formed upon the interaction of nitrogen plasma with the molten polymer, and correspondingly induce growth of compact films of carbon deposits instead of nanocarbon. A lower power density suppresses the interaction of nitrogen plasma with the molten polymer, thus reducing or minimizing the quantity of gaseous products formed upon the interaction of nitrogen plasma with the molten polymer, which can lead to a lower deposition rate. In some examples, the discharge power density is between about 0.1 and 100 $MW/m^3$, e.g., between 1 and 30 $MW/m^3$. The discharge can be powered with an RF discharge in the inductive mode, or with a microwave discharge.

In some examples, the substrate where the deposition of nanocarbon takes place is heated to help ensure de-hydrogenation of the deposits. The substrate temperature can be above 500° C., above 700° C. or above 900° C., or above 1000° C., such as between 300° C. and 1200° C. or between 600° C. and 900° C. A substrate heated to this temperature encourages the formation of nanocarbon almost free from hydrogen.

The rest of the plasma reactor, e.g., other than the substrate and the molten polymer, is kept at lower temperature, for example just above room temperature. This helps ensure that power is not lost to heating objects other than the molten polymer and the substrate.

The pressure in the plasma reactor is low, which helps ensure fragmentation of the gaseous products formed upon the interaction of nitrogen plasma with the molten polymer. In addition, the low pressure suppresses formation of macroscopic particles in the plasma reactor and the formation of dusty plasma. For instance, the pressure in the plasma reactor can be in the range between 1 and 1000 Pa, e.g., between 0.5 and 100 Pa or between 1 and 50 Pa. The reactor pressure depends on the discharge power and geometrical factors.

The type of the substrate is not particularly limited. The substrate may be any suitable metal that does not melt at elevated temperature, or silicon or carbon (like carbon cloth, graphite or a similar form of carbon that withstands heating to elevated temperature), or any suitable dielectric material such as glasses and ceramics.

The purity of nitrogen leaked into the plasma reactor is not particularly limited. Commercial purity of 99% is acceptable and so are traces of gaseous impurities in the plasma reactor. A typical plasma reactor will contain residual atmosphere which often contains water vapour. Several % of impurity gases are tolerated. In some examples, the partial pressure of gases other than nitrogen is below 3% of the nitrogen partial pressure. Nitrogen may be replaced with ammonia or another nitrogen-containing gas but addition of other gases (like hydrogen in the case of ammonia) slows down the deposition rate.

Typically, the gaseous plasma is non-equilibrium but rich in molecular fragments. For example, the dissociation fraction of nitrogen molecules may be of the order of 10%. Such a high dissociation fraction helps ensure extensive chemical reactions of nitrogen species with the surface of the molten polymer. Positively charged nitrogen ions also interact chemically on the surface of the molten polymer. The nitrogen molecules are inert and do not interact with the polymer surface.

Figure 2A:
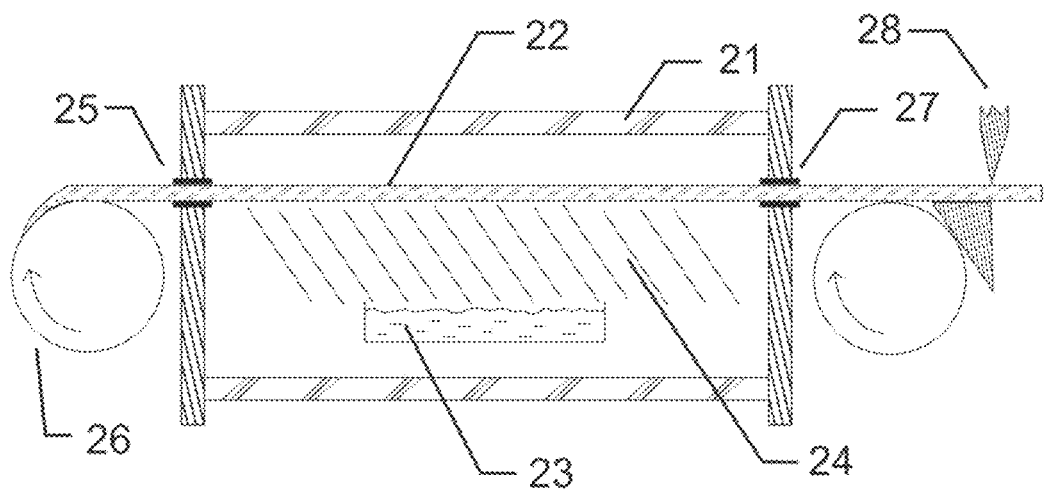
FIG. 2A is a diagram of a system for deposition of nitrogen-containing nanocarbon.

FIG. 2A shows a diagram of a system for deposition of nitrogen-containing nanocarbon. The system of FIG. 2 is useful, e.g., for continuous mode deposition. A substrate 22 is an elongated substrate, such as a belt, running from a roll 26 via a first vacuum tight through-hole 25 into a plasma reactor 21. The interior of the reactor 21 holds a container of molten polymer 23. A gaseous plasma 24 is sustained in the plasma reactor 21, and the gaseous plasma 24 is particularly dense in the volume between the substrate 22 and the container of molten polymer 23. The deposition of N-rich nanocarbon occurs during the passing of the substrate 22 through the dense plasma 24. The substrate continues via a second vacuum tight through-hole 27 to a cutting device 28 that cuts the substrate with the deposited nitrogen-containing nanocarbon to desired dimensions.

Figure 2B:
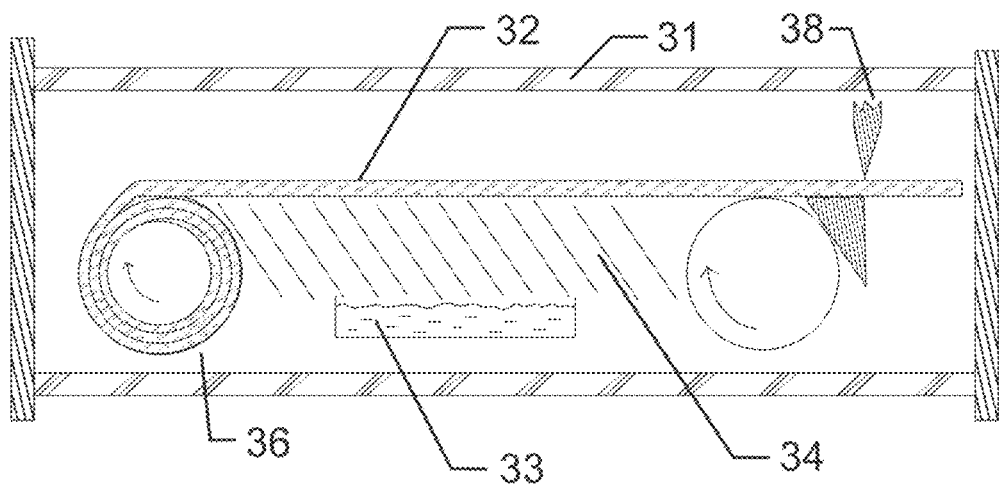
FIG. 2B is a diagram of a system for deposition of nitrogen-containing nanocarbon.

FIG. 2B shows a diagram of a system for deposition of nitrogen-containing nanocarbon. The system of FIG. 2B is useful, e.g., for continuous mode deposition. A substrate 32 is an elongated substrate, such as a belt, running from a roll 36 that is disposed in a plasma reactor 31. The interior of the reactor 31 holds a container of molten polymer 33. A gaseous plasma 34 is sustained in the plasma reactor 31, and the gaseous plasma 34 is particularly dense in the volume between the substrate 32 and the container of molten polymer 33. The deposition of N-rich nanocarbon occurs during the passing of the substrate 32 through the dense plasma 34. The substrate continues to a cutting device 38 disposed in the reactor 31. The cutting device 38 cuts the substrate with the deposited nitrogen-containing nanocarbon to desired dimensions.

Nitrogen-containing nanocarbon can be used in electrochemical devices such as super-batteries, super-capacitors, or fuel cells.

Example

The configuration shown in FIG. 1 was used to synthesize nitrogen-doped nanocarbon. The nitrogen pressure in plasma reactor 1 was set to 15 Pa, and the discharge power density to 7 MW/m$^3$. Plasma was sustained by inductively coupled RF discharge. The substrate was a titanium sheet of commercial purity 99.5%. The molten polymer was polyethylene terephthalate heated to 350° C. The deposition rate was about 50 nm/s.

Figure 3:
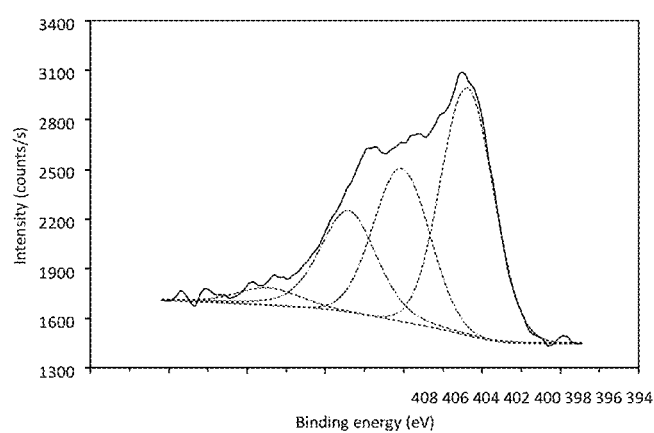
FIG. 3 is a high-resolution N1s X-ray photoelectron spectroscopy (XPS) spectrum of nanocarbon with 10 atomic % nitrogen.

The XPS survey spectrum of the nitrogen-doped carbon nanomaterial showed 89 atomic % carbon, 10 atomic % nitrogen and 1 atomic % oxygen. Hydrogen was not detected by XPS. The high-resolution N1s XPS peak of nitrogen is shown in FIG. 3. The peak includes several sub-peaks which were de-convoluted to a pyridinic peak at 398.5 eV, a pyrrolic and pyridone peak at 400.4 eV, a graphitic peak at 401.7 eV, and oxidized pyridinic peak at 403.5 eV. The concentrations of nitrogen corresponding to these binding sites are calculated from the de-convoluted spectrum in FIG. 3 and are 47, 31, 197 and 3%. This spectrum demonstrates that about half of the nitrogen is bonded in as pyridinic nitrogen, so free from oxygen or hydrogen. This is advantageous in applications such as electrochemical devices.

Figure 4:
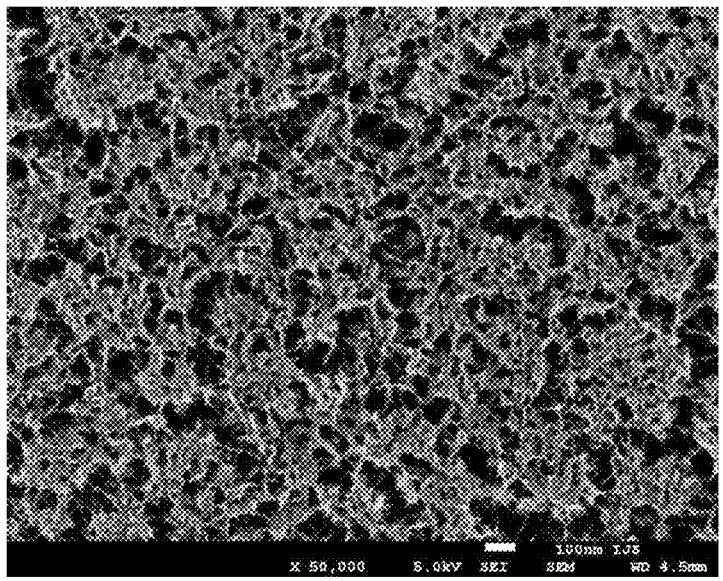
FIG. 4 is a scanning electron microscope image of nanocarbon doped with 10 atomic % of nitrogen.

The scanning electron microscope image of this sample of nitrogen-doped carbon nanomaterial is shown in FIG. 4. The nanocarbon forms a mesh-like structure with a distance between neighboring features in the range of between about 20 and 100 nm. This structure is useful in applications such as electrochemical devices.

Figure 5:
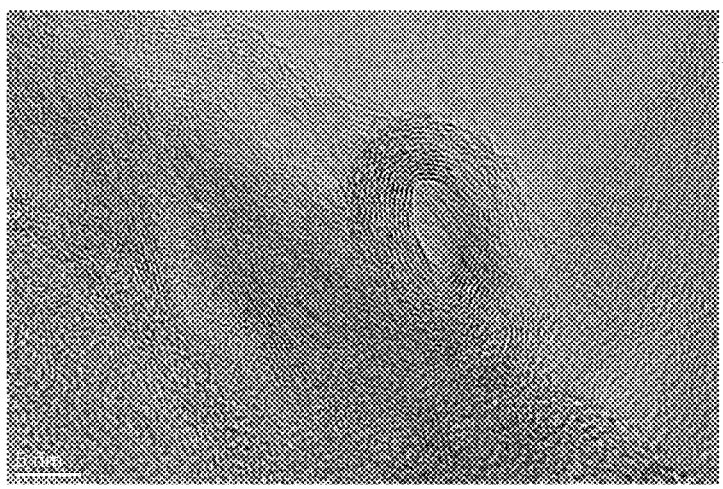
FIG. 5 is a transmission electron microscope image of nanocarbon doped with 10 atomic % of nitrogen.

The transmission electron microscope image of this sample of nitrogen-doped carbon nanomaterial is shown in FIG. 5. A highly crystalline phase typical for multilayer graphene sheets can be seen in this image.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method for deposition of nitrogen-doped nanocarbon comprising:
    disposing molten polymer and a heated substrate in a plasma reactor, wherein the molten polymer is at a temperature of between 20° and 600° C. and the heated substrate is at a temperature of between 30° and 1200° C.;
    providing dense nitrogen-containing plasma in the plasma reactor in a space between the molten polymer and the heated substrate, wherein providing the dense nitrogen plasma comprises applying a power used of between 1 and 30 MW/m$^3$, and wherein the nitrogen pressure in the plasma reactor is between 1 and 50 Pa; and
    allowing the dense nitrogen-containing plasma to interact with both the molten polymer and the heated substrate to form a film of nitrogen-containing nanocarbon on the heated substrate;
    wherein the molten polymer comprises polyethylene terephthalate.

2. The method of claim 1, wherein the molten polymer is at a temperature of between 30° and 400° C.

3. The method of claim 1, wherein the heated substrate is at a temperature of between 60° and 900° C.

4. The method of claim 1, comprising sustaining the nitrogen plasma by a low-pressure gaseous discharge.

5. The method of claim 4, comprising sustaining the nitrogen plasma by inductively coupled radiofrequency discharge.

6. The method of claim 4, comprising sustaining the nitrogen plasma by microwave discharge.

7. The method of claim 1, wherein disposing the heated substrate in the plasma reactor comprises moving an elongated substrate through the reactor.

8. The method of claim 7, comprising cutting the elongated substrate following formation of the film of nitrogen-containing nanocarbon on the substrate.

9. The method of claim 1, wherein the dense nitrogen-containing plasma comprises nitrogen or ammonia gas.

10. The method of claim 1, wherein the heated substrate comprises titanium.

11. A method of making an electrochemical device, the method comprising:
    depositing a film of nitrogen-doped nanocarbon, comprising:
        disposing molten polymer and a heated substrate in a plasma reactor, wherein the molten polymer is at a temperature of between 20° and 600° C. and the heated substrate is at a temperature of between 30° and 1200° C.;
        providing nitrogen-containing plasma in the plasma reactor in a space between the molten polymer and the heated substrate, wherein providing the dense nitrogen plasma comprises applying a power used of between 1 and 30 MW/m$^3$, and wherein the nitrogen pressure in the plasma reactor is between 1 and 50 Pa; and
        allowing the nitrogen-containing plasma to interact with both the molten polymer and the heated substrate to form the film of nitrogen-containing nanocarbon on the heated substrate; and
    forming an electrochemical device containing the film of nitrogen-containing nanocarbon;
    wherein the molten polymer comprises polyethylene terephthalate.

12. The method of claim 11, wherein the electrochemical device comprises a super-battery.

13. The method of claim 11, wherein the electrochemical device comprises a super-capacitor.

14. The method of claim 11, wherein the electrochemical device comprises a fuel cell.

15. A method comprising:
- disposing a molten polymer and a substrate in a plasma reactor, wherein the molten polymer is at a temperature of between 200° C. and 500° C.;
- heating the substrate to a temperature of between 300° C. and 1200° C.;
- maintaining a pressure in the plasma reactor of between 1 and 1000 Pa;
- providing a gaseous, nitrogen-containing plasma in the plasma reactor by application of a power density of between 0.1 and 100 MW/m$^3$;
- allowing the gaseous, nitrogen-containing plasma to interact with the molten polymer and the heated substrate to deposit a film of nitrogen-containing nanocarbon on the heated substrate;
- wherein the molten polymer comprises polyethylene terephthalate.

* * * * *